United States Patent [19]

Sivertsen

[11] 3,789,276

[45] Jan. 29, 1974

[54] MULTILAYER MICROELECTRONIC CIRCUITRY TECHNIQUES

[75] Inventor: David R. Sivertsen, Dallas, Tex.

[73] Assignee: Texas Instruments Incorporated, Dallas, Tex.

[22] Filed: Aug. 6, 1970

[21] Appl. No.: 61,797

Related U.S. Application Data

[62] Division of Ser. No. 744,983, July 15, 1968, Pat. No. 3,453,723.

[52] U.S. Cl. ..... 317/235 R, 317/235 D, 317/235 F, 317/235 AY

[51] Int. Cl. .......... H01l 19/00

[58] Field of Search ..... 148/175; 317/235 F, 235 D, 317/235 AY

[56] References Cited

UNITED STATES PATENTS

| | | | |
|---|---|---|---|
| 3,433,686 | 3/1969 | Marinace | 317/235 F |
| 3,534,234 | 10/1970 | Clevenger | 317/235 |
| 3,488,835 | 1/1970 | Becke et al. | 317/235 F |
| 3,425,879 | 2/1969 | Shaw et al. | 317/235 F |
| 3,580,732 | 5/1971 | Blakeslee et al. | 317/235 F |
| 3,620,833 | 11/1971 | Gleim et al. | 317/235 F |
| 3,602,982 | 9/1971 | Kooi | 317/235 F |
| 3,507,713 | 4/1970 | Kravitz | 317/235 F |
| 3,471,754 | 10/1969 | Hoshi et al. | 317/235 F |
| 3,400,309 | 9/1968 | Doo | 317/234 |
| 3,575,733 | 4/1971 | Cecil | 148/1.6 |

*Primary Examiner*—Rudolph V. Rolinec
*Assistant Examiner*—William D. Larkins
*Attorney, Agent, or Firm*—Harold Levine; Jim Comfort, Gary C. Honeycutt

[57] ABSTRACT

A microelectronic circuit fabrication technique where an electron beam forms hillocks of single crystal material through a dielectric layer from a single crystal substrate. A single crystal is then grown atop each hillock over the dielectric layer by first epitaxially depositing material using the hillock as a nucleation site. The epitaxially deposited material is next expanded by means of a scanning electron beam into a broad area of single crystal material. This single crystal may be patterned to form component sites. Multilayer structures are formed by covering each previous dielectric layer and component sites with a subsequent dielectric layer and repeating the process of single crystal growth using extensions of the hillocks as nucleation sites.

10 Claims, 7 Drawing Figures

PATENTED JAN 29 1974

3,789,276

INVENTOR

DAVID R. SIVERTSEN

Gary C. Honeycutt

ATTORNEY

MULTILAYER MICROELECTRONIC CIRCUITRY TECHNIQUES

Figure 1:
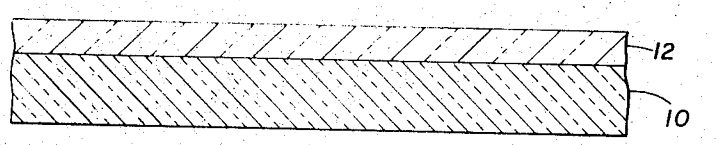
Figure 2:
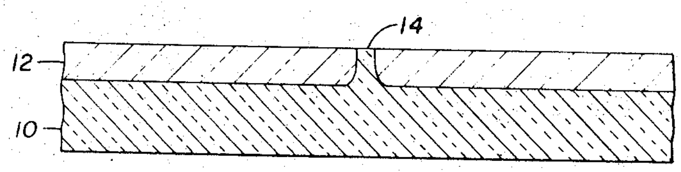

This application is a division of application Ser. No. 744,983, filed July 15, 1968, now U.S. Pat. No. 3,453,723.

This invention relates to a microelectronic circuit fabrication technique, and more particularly to multilayer microelectronic circuitry fabricated by means of electron beam energy.

In the patent application of Olin B, Cecil, filed Jan. 3, 1966, Ser. No. 518,099, now U.S. Pat. No. 3,453,723 and assigned to the assignee of the present invention, there is described a technique for electron beam formation of protuberances or hills on monocrystalline semiconductor material in which circuit components are subsequently fabricated. The technique described employs a high energy beam of electrons directed at a single crystal wafer substrate. By pulsing the electron beam in a predetermined program over the area of the wafer, a plurality of protuberances or hills of single crystalline material are produced at desired locations and having given dimensions. Typically, the voltage of the high energy beam is approximately 100keV with a beam current at slightly less than 5 microamps; the pulse frequency is approximately 250Hz.

Heretofore, various semiconductor devices, such as transistors, diodes, and resistors, were formed in these protuberances or hills, or in areas outlined by electron beam cutting techniques. That is, in addition to the usual manner of processing by means of photomasks and chemical etching. By any one, or a combination of these techniques, a planar integrated circuit could be fabricated. However, because of alignment difficulties, especially with the photomask and etch technique, it was difficult if not impossible to fabricate multilayer circuitry.

Although the electron beam technique described in the above copending application produced relatively pure single crystal component sites, other techniques of planar integrated circuit fabrication produced component sites which often contain unwanted impurities. These impurities often adversely affected device operation. Further, the photomask and chemical etching processes are not conducive to reliably producing a high concentration of circuit components.

To produce a large number of highly concentrated reliable component elements on a wafer, it is an object of this invention to provide a multilayer microelectronic circuit. Another object of this invention is to provide microelectronic circuitry fabricated by means of an electron beam along with other processing techniques. A further object of this invention is to provide microelectronic circuitry in a three dimensional stacked configuration. Still another object of this invention is to provide microelectronic circuitry having relatively pure single crystal component sites.

In accordance with the present invention, a microelectronic circuit will be fabricated from a wafer of single crystal substrate covered with a dielectric or insulating layer. An energy beam directed to the wafer vaporizes a hole in the dielectric layer and forms a hillock on the substrate through the vaporized opening. A single crystal component site is grown on top of the dielectric layer by means of a scanning energy beam using the hillock as a nucleating site. Subsequent layers of oxide and subsequent layers of component sites are also formed by the energy beam vaporizing holes in the dielectric layer and extending the original hillock.

A more complete understanding of the invention and its advantages will be apparent from the specification and claims and from the accompanying drawings illustrative of the invention.

Referring to the drawings:

FIGS. 1 through 7 are sectional views, dimensionally exaggerated, of a wafer illustrating the subsequent steps for the fabrication of multilayer microelectronic circuitry.

To achieve multilayer microelectronic circuitry as the end product, a combination of electron beam, ion beam and chemical reaction techniques may be employed. Other combinations of focused energy sources and conventional semiconductor technology (such as furnace type fusion) may be employed to achieve the desired result. The invention, however, will be described with particular emphasis on electron beam techniques for producing the various component layers.

The starting material is a single crystal substrate 10, such as silicon, covered with a dielectric or insulating layer 12, such as silicon dioxide. While the description of this invention will be centered about silicon as the base material, other materials such as germanium and gallium arsenide as well as other semiconductors in Groups II – VI and III–V of the Periodic Table, may also be employed. Although the substrate 10 may be any semiconductor material, as well as any initial resistivity, the invention will be described making reference to a single crystal of low resistivity N+ silicon covered with a silicon dioxide layer 12, having a thickness on the order of 5,000 A. Further, while only one component site has been illustrated in the FIGURES, it should be understood that a given wafer may contain dozens or even hundreds of component sites with each component site made up of any one or combinations of transistors, diodes, and other circuit components.

Electron beam apparatus as used in the fabrication of microelectronic circuitry has been thoroughly described in the above-mentioned patent application, Ser. No. 518,099, and in many U. S. Patents, such as No. 3,340,601, and a detailed description is not deemed necessary. In an electron beam generator, a stream of high energy electrons is emitted by a heated cathode which connects to a source of heating current. The electrons emitted by the cathode of an electron generator are caused to be accelerated toward the substrate 10 by a negative DC acceleration voltage applied between the cathode and a grounded annode. In the usual manner, the accelerated electrons may be focused into a beam and controlled in a particular pattern by means of sets of deflector plates. Typically, the cathode emits electrons in pulses having a time duration of from 5 to 25 microseconds at a frequency of approximately 250 pulses per second. The energy of the beam as it strikes the substrate 10 is on the order of from 0.5 to 1.0 mulliwatts/cm$^2$. As has been demonstrated in many documented experiments, an electron beam can be positioned with an accuracy of approximately 5 microns. Thus, electron beam fabrication of microelectronic circuitry has a definite accuracy advantage over the standard photomask and chemical etching techniques.

Two of the many advantages of electron beam techniques for the fabrication of microelectronic circuitry is the extremely narrow fusion zone of the beam, and the controllability of the beam location. Fusion zones of the desired shape and located in a predetermined spatial relationship may be produced with an electron beam within extremely small tolerances. In the present invention, the electron beam is pulsed across the surface of the dielectric layer 12 in a predetermined configuration at an energy level just below that required for vaporizing the single crystal substrate 10. Although having insufficient energy to vaporize the substrate 10, the energy beam does have sufficient energy to vaporize a hole in the dielectric layer 12. As a result, a plurality of hillocks, such as hillock 14 of FIG. 2, of single crystalline silicon material are formed upon the substrate 10 through the dielectric layer 12. Note, that the hillock 14 is not formed by cutting or etching notches into the substrate 10, but rather by a material expansion above the original surface of the substrate. Laboratory investigation of hillocks formed in this manner have proven that there is a volumetric expansion of the substrate 10.

Figure 3:
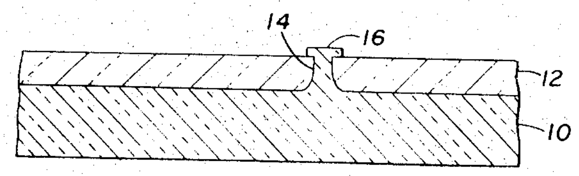

After the hillock 14 has been formed on the substrate 10, a small area of single crystal material 16 is epitaxially formed over the dielectric layer 12 using the hillock as nucleating site. As mentioned previously, other processes besides electron beam techniques may be used in the complete fabrication of multilayer microelectronic circuitry. In the case of the crystal 16, a standard gas-phase reaction may be employed to form a single crystal upon the single crystal hillock 14 such that the lattice structure of the resulting layer is an exact extension of the substrate crystal structure. As shown in FIG. 3, there now exists two layers of single crystal material which may be used as a site for the formation of transistors or other semiconductor devices. These layers may be interconnected or, by removing the hillock 14, electrically isolated to form independent circuitry.

Figure 4:
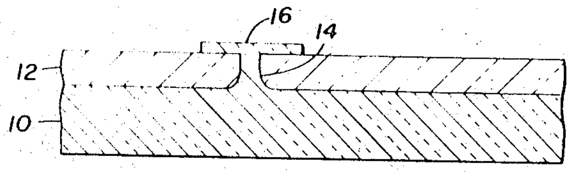
Figure 5:
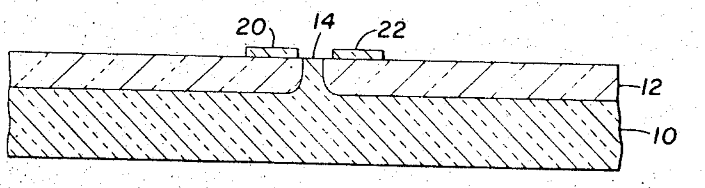

If desired, the area of the crystal 16 can be expanded by means of a scanning electron beam that actually "grows" the silicon into an area greater than could be achieved by epitaxial deposition of the silicon alone. This is illustrated in FIG. 4 where the crystal 16 has been expanded over the dielectric layer 12 by means of a scanning electron beam 18, shown schematically. The growth of the silicon can be accomplished by using a scanning beam by itself, or in combination with a chemical vapor atmosphere of epitaxial vapor (such as trichlorosilane). This expanded area may be used as a component site for the formation of semiconductor devices by photomasking and diffusion of doped regions. Preferably, the region 16 will be divided into several component sites, such as 20 and 22, by means of a photomask and chemical etch to isolate these sites from the hillock 14.

Figure 6:
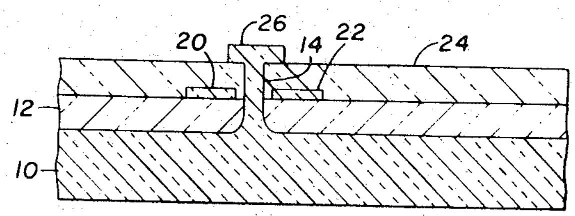

To form additional layers of circuitry, the dielectric layer 12 and the component sites 20 and 22 are covered with a second dielectric layer 24, as shown in FIG. 6, by any of the standard oxide formation techniques. This second dielectric layer 24 is deposited to a depth on the order of microns. A repeat of the steps of forming a hole in the dielectric layer and extending the hillock 14 will now be carried out. Directing the high energy electron beam to the dielectric layer 24 in the area of the hillock 14 vaporizes a hole in the dielectric layer and causes a further expansion of the substrate material 10, thereby increasing the height of the hillock 14. Subsequently, a crystal 26 is epitaxially deposited on the dielectric layer 24, again using the hillock 14 as a nucleation site. This crystal is expanded by means of a scanning electron beam and patterned by a photomask and etch technique.

Through laboratory experiments, it has been shown that by the proper selection of beam energy parameters a hillock may be grown to a height of several mils. Since the thickness of the dielectric layers 12 and 24 is on the order of microns, the above described processes may be repeated to form microelectronic circuitry on a number of layers and at preselected locations either lying on or sandwiched between material of dielectric composition. These circuitry layers may be interconnected by means of a hillock or electrically independent. Where desirable, a hillock may be removed after completion of the circuitry layers by an electron beam having an energy level sufficient to vaporize the hillock.

Figure 7:
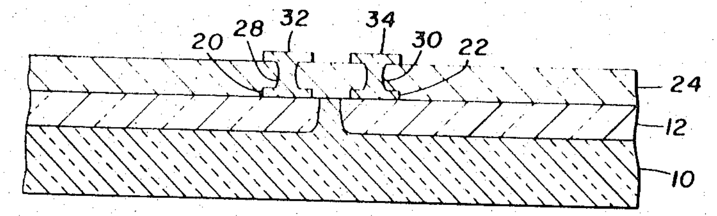

In addition to extending the hillock 14 through subsequent layers of dielectric material, the energy beam may be directed at the component sites 20 and 22 thus forming hillocks 28 and 30, as shown in FIG. 7, for additional nucleating sites at the surface of the dielectric layer 24. Hillocks such as 28 and 30 are of particular importance when the circuitry on the component sites 20 and 22 is to be interconnected to component sites on the dielectric layer 24. In accordance with steps previously described, regions 32 and 34 of single crystal material may be epitaxially deposited on the dielectric layer 24 using the hillocks 28 and 30 as nucleation sites. These single crystal areas may be expanded by using either a scanning energy beam by itself or in combination with a chemical atmosphere of epitaxial vapor (such as dry trichlorosilane). A combination of effects can be achieved by using electron beam technology alone or in combination with photomask and chemical etch techniques as adequately emphasized previously.

Very precise patterns of hillocks and component sites may be formed by the techniques described herein which are not only simpler but also enable a higher degree of microminiaturization than that previously obtainable by photographic masking and etching techniques. Although particular emphasis has been placed on the use of electron beams, it is also contemplated that other concentrated sources of energy, such as a laser, may be utilized in like manner to form the plurality of hillocks of single crystalline material. For silicon substrates, the dielectric layer may be a silicon nitride or a silicon carbide in addition to a silicon dioxide.

While several embodiments of the invention, together with modifications thereof, have been described in detail herein and illustrated in the accompanying drawings, it will be evident that various further modifications are possible without departing from the scope of the invention.

What is claimed is:

1. A three-dimensional composite microelectronic circuit structure comprising:

a single crystalline semiconductor substrate, a layer of dielectric material overlaying said substrate and in non-epitaxial relationship therewith, having selectively located holes therein, and a plurality of single crystal islands of semiconductor material discretely located on said dielectric layer, selective ones of said plurality overlaying and extending a substantial distance laterally of respective ones of said holes and electrically connected to said substrate through said respective ones of said holes by single crystalline material.

2. The three-dimensional composite microelectronic circuit structure of claim 1 further comprising at least one additional layer of dielectric material overlaying said substrate wherein said plurality of single crystal islands of semiconductor material is sandwiched between said dielectric layer and said at least one additional dielectric layer.

3. A three-dimensional composite micro-electronic circuit structure as set forth in claim 2 including a. a second plurality of islands on said at least one additional layer and b. hillocks of single crystal material interconnecting selective islands of said first plurality with selective islands of said second plurality.

4. A three-dimensional composite microelectronic circuit structure as set forth in claim 3, including hillocks of single crystal material selectively interconnecting said substrate with said first and second plurality.

5. A three-dimensional composite microelectronic circuit structure as set forth in claim 2 wherein said single crystal substrate and said islands are single crystal silicon.

6. The three-dimensional composite microelectronic circuit structure as set forth in claim 1 wherein said dielectric layer comprises a semiconductor compound.

7. A multilayer microelectronic circuit having a single crystal semiconductor substrate with a dielectric overlay in non-epitaxical relationship with said substrate having holes selectively located therein comprising a plurality of single crystal hillocks on the surface of said single crystal protruding into and through said holes of said overlay, and a component situs comprising an island of single crystal material on the dielectric overlay adjacent each of said hillocks for forming electronic circuit components therein, at least some of said component sites electrically connected to said substrate by respective ones of said hillocks and extending on to the dielectric layer a substantial distance laterally of said respective ones of said hillock.

8. A multilayer microelectronic circuit as set forth in claim 7 including a second dielectric layer deposited over the preceding dielectric layer and component sites having selectively located holes therein, a second plurality of hillocks protruding into and through said holes of said second layer, and second component sites comprising single crystal material at each of said second plurality for forming electronic circuit elements therein.

9. A multilayer microelectronic circuit formed from a single crystal substrate as set forth in claim 8 wherein said component sites are low resistivity N+ silicon.

10. The multilayer microelectronic circuit as set forth in claim 7 wherein the dielectric layer comprises a compound of said semiconductor.

* * * * *